United States Patent
Cho

(10) Patent No.: US 9,576,620 B2
(45) Date of Patent: Feb. 21, 2017

(54) SEMICONDUCTOR APPARATUS AND OPERATING METHOD THEREOF

(71) Applicant: SK hynix Inc., Icheon-si Gyeonggi-do (KR)

(72) Inventor: Ho Sung Cho, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 98 days.

(21) Appl. No.: 14/636,814

(22) Filed: Mar. 3, 2015

(65) Prior Publication Data

US 2016/0141009 A1 May 19, 2016

(30) Foreign Application Priority Data

Nov. 17, 2014 (KR) .................. 10-2014-0160070

(51) Int. Cl.
| | |
|---|---|
| *G11C 19/00* | (2006.01) |
| *G11C 7/10* | (2006.01) |
| *G06F 9/30* | (2006.01) |
| *G11C 16/32* | (2006.01) |
| *H03M 9/00* | (2006.01) |
| *G11C 29/12* | (2006.01) |
| *G11C 16/10* | (2006.01) |

(52) U.S. Cl.
CPC .......... *G11C 7/1036* (2013.01); *G06F 9/30105* (2013.01); *G06F 9/30134* (2013.01); *G11C 16/32* (2013.01); *G11C 29/1201* (2013.01); *H03M 9/00* (2013.01); *G11C 16/10* (2013.01)

(58) Field of Classification Search
CPC .................................................. G11C 19/00
See application file for complete search history.

(56) References Cited

U.S. PATENT DOCUMENTS 6,654,439 B1* 11/2003 Kommrusch ........ H03K 23/665
377/54

FOREIGN PATENT DOCUMENTS

KR     1020000003933 A     1/2000

* cited by examiner

*Primary Examiner* — Hai L Nguyen
(74) *Attorney, Agent, or Firm* — William Park & Associates Ltd.

(57) ABSTRACT

A semiconductor apparatus including a register input selection block configured to serially receive input data and output the input data in parallel as first and second data sets, or receive register selection output signals and output the register selection output signals as the first and second data sets, in response to a shift control signal and a capture control signal; a first data register configured to receive and store the first data set and output stored data as first register output signals; a second data register configured to receive and store the first and second data sets and output stored data as second register output signals; a register output selection block configured to output ones of the first and second register output signals as the register selection output signals; and a data output selection block configured to serially output one of the first and second data sets as output data.

17 Claims, 5 Drawing Sheets

SEMICONDUCTOR APPARATUS AND OPERATING METHOD THEREOF

CROSS-REFERENCES TO RELATED APPLICATION

The present application claims priority under 35 U.S.C. §119(a) to Korean application number 10-2014-0160070, filed on Nov. 17, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus may be developed to perform various operations.

In particular, in a test operation of a semiconductor apparatus, in order to simulate test conditions, a semiconductor apparatus may be configured to store control signals or may be configured to receive data inputted from an exterior. In the test operation of the semiconductor apparatus, in order to simulate test conditions, the semiconductor apparatus may selectively output control signals or data meeting the test conditions among the control signals or data stored according to the commands inputted from an exterior.

Unlike a semiconductor apparatus of a wafer state, a packaged semiconductor apparatus is limited in the number of pins or pads through which control signals or data may be inputted from an exterior. Therefore, development of a semiconductor apparatus capable of storing control signals or data to perform operations of specific conditions and thereby performing various operations by meeting the specific conditions using the control signals or data continues.

SUMMARY

In an embodiment, a semiconductor apparatus may include a register input selection block configured to receive input data of a serial type and output the input data as a first data set and a second data set of a parallel type, or receive register selection output signals and output the register selection output signals as the first and second data sets, in response to a shift control signal and a capture control signal. The semiconductor apparatus may include a first data register configured to receive and store the first data set and output stored data as first register output signals. The semiconductor apparatus may include a second data register configured to receive and store the first and second data sets and output stored data as second register output signals. The semiconductor apparatus may include a register output selection block configured to output ones of the first and second register output signals as the register selection output signals. The semiconductor apparatus may include a data output selection block configured to serially output one of the first and second data sets as output data.

In an embodiment, an operating method of a semiconductor apparatus may include a data inputting action of outputting input data of a serial type as at least one data set of a parallel type. The operating method of the semiconductor apparatus may include a data storing action of storing the at least one data set in one of a plurality of data registers. The operating method of the semiconductor apparatus may include a data selecting action of selecting data stored in one of the plurality of data registers and outputting the data stored in the selected data register, as register selection output signals. The operating method of the semiconductor apparatus may include a data capturing action of storing the register selection output signals and outputting stored signals as first and second data sets. The operating method of the semiconductor apparatus may include a data shifting action of shifting respective bits of the first and second data sets of a parallel type and outputting data of a serial type. The operating method of the semiconductor apparatus may include a data outputting action of outputting one of the shifted first and second data sets, as output data.

DETAILED DESCRIPTION

Hereinafter, a semiconductor apparatus and an operating method thereof will be described below with reference to the accompanying drawings through various examples of embodiments.

Figure 1:
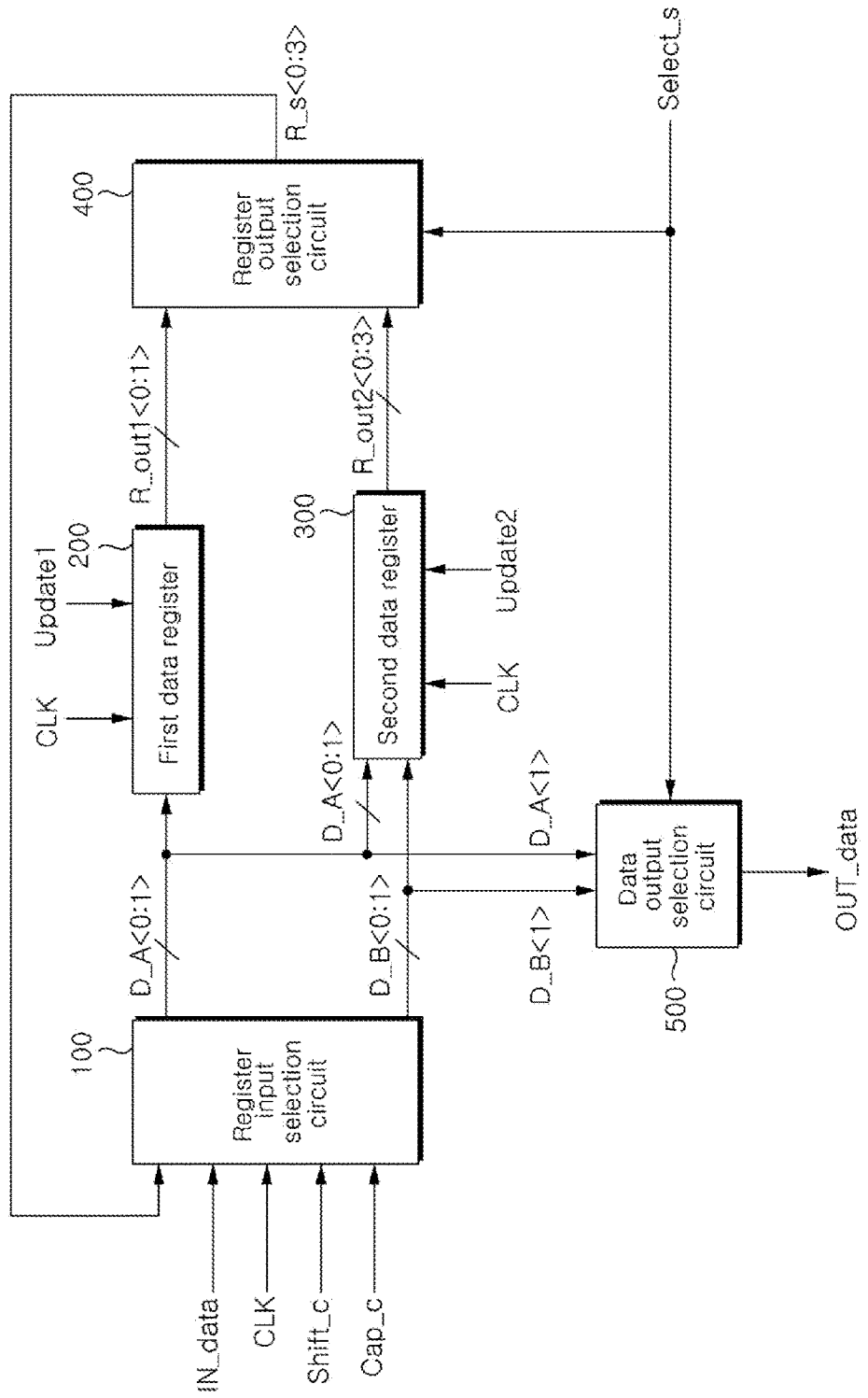
FIG. 1 is a configuration diagram illustrating a representation of an example of a semiconductor apparatus in accordance with an embodiment.

Referring to FIG. 1, a semiconductor apparatus in accordance with an embodiment may include a register input selection block 100, a first data register 200, and a second data register 300. The semiconductor apparatus may include a register output selection block 400, and a data output selection block 500. The register input selection block 100 may be configured for receiving a clock CLK signal. The first data register 200 may be configured for receiving a clock CLK signal. The second data register 300 may be configured for receiving a clock CLK signal.

The register input selection block 100 may output ones of input data IN_data and register selection output signals R_s<0:3> as a first data set D_A<0:1> and a second data set D_B<0:1>. The ones of input data IN_data and register selection output signals R_s<0:3> may be outputted by the register input selection block 100 as the first data set D_A<0:1> and the second data set D_B<0:1> in response to a shift control signal Shift_c and a capture control signal Cap_c. For example, the register input selection block 100 may output the input data IN_data of a serial type as the first and second data sets D_A<0:1> and D_B<0:1> of a parallel type, in response to the shift control signal Shift_c and the capture control signal Cap_c. The register input selection block 100, for example, may output the register selection output signals R_s<0:3> of a parallel type as the first and second data sets D_A<0:1> and D_B<0:1> of a parallel type, in response to the shift control signal Shift_c and the capture control signal Cap_c.

The first data register 200 may receive and store the first data set D_A<0:1> and output stored data as first register output signals R_out1<0:1>, in response to a first update signal Update1. For example, if the first update signal Update1 is enabled, the first data register 200 receives and stores the first data set D_A<0:1> and outputs the stored data as the first register output signals R_out1<0:1>. If, for example, the first update signal Update1 is disabled, the first data register 200 outputs the previous data stored therein, as the first register output signals R_out1<0:1>, regardless of the first data set D_A<0:1>.

The second data register 300 may receive and store the first and second data sets D_A<0:1> and D_B<0:1> and output stored data as second register output signals R_out2<0:3>, in response to a second update signal Update2. For example, if the second update signal Update2 is enabled, the second data register 300 receives and stores the first and second data sets D_A<0:1> and D_B<0:1> and outputs the stored data as the second register output signals R_out2<0:3>. If, for example, the second update signal Update2 is disabled, the second data register 300 outputs the previous data stored therein, as the second register output signals R_out2<0:3>, regardless of the first and second data sets D_A<0:1> and D_B<0:1>.

The register output selection block 400 may output ones of the first register output signals R_out1<0:1> or the second register output signals R_out2<0:3>, as the register selection output signals R_s<0:3>, in response to a selection signal Select_s. For example, if the selection signal Select_s is enabled, the register output selection block 400 outputs the first register output signals R_out1<0:1> as the register selection output signals R_s<0:3>. If, for example, the selection signal Select_s is disabled, the register output selection block 400 outputs the second register output signals R_out2<0:3> as the register selection output signals R_s<0:3>. The example where the selection signal Select_s is enabled may be described below as follows. If the selection signal Select_s is enabled, the register output selection block 400 outputs the first register output signals R_out1<0:1> as the first and second register selection output signals R_s<0:1> of the register selection output signals R_s<0:3>, and disregards the remaining register selection output signals R_s<2:3>. The register output selection block 400 selects and outputs ones of the signals R_out1<0:1> and R_out2<0:3> outputted by the two data registers 200 and 300, in response to the selection signal Select_s. Therefore, since the register output selection block 400 is configured to output the two signals R_out1<0:1> or the four signals R_out2<0:3>, the register output selection block 400 needs four signal lines, and, thus, in the example where two signals are outputted, the remaining two signal lines remains in an idle state.

The data output selection block 500 may output one of the last data D_A<1> of the first data set D_A<0:1> or the last data D_B<1> of the second data set D_B<0:1>, as output data OUT_data, in response to the selection signal Select_s. For example, if the selection signal Select_s is enabled, the data output selection block 500 outputs the last data D_A<1> of the first data set D_A<0:1> as the output data OUT_data. If, for example, the selection signal Select_s is disabled, the data output selection block 500 outputs the last data D_B<1> of the second data set D_B<0:1> as the output data OUT_data.

Figure 2:
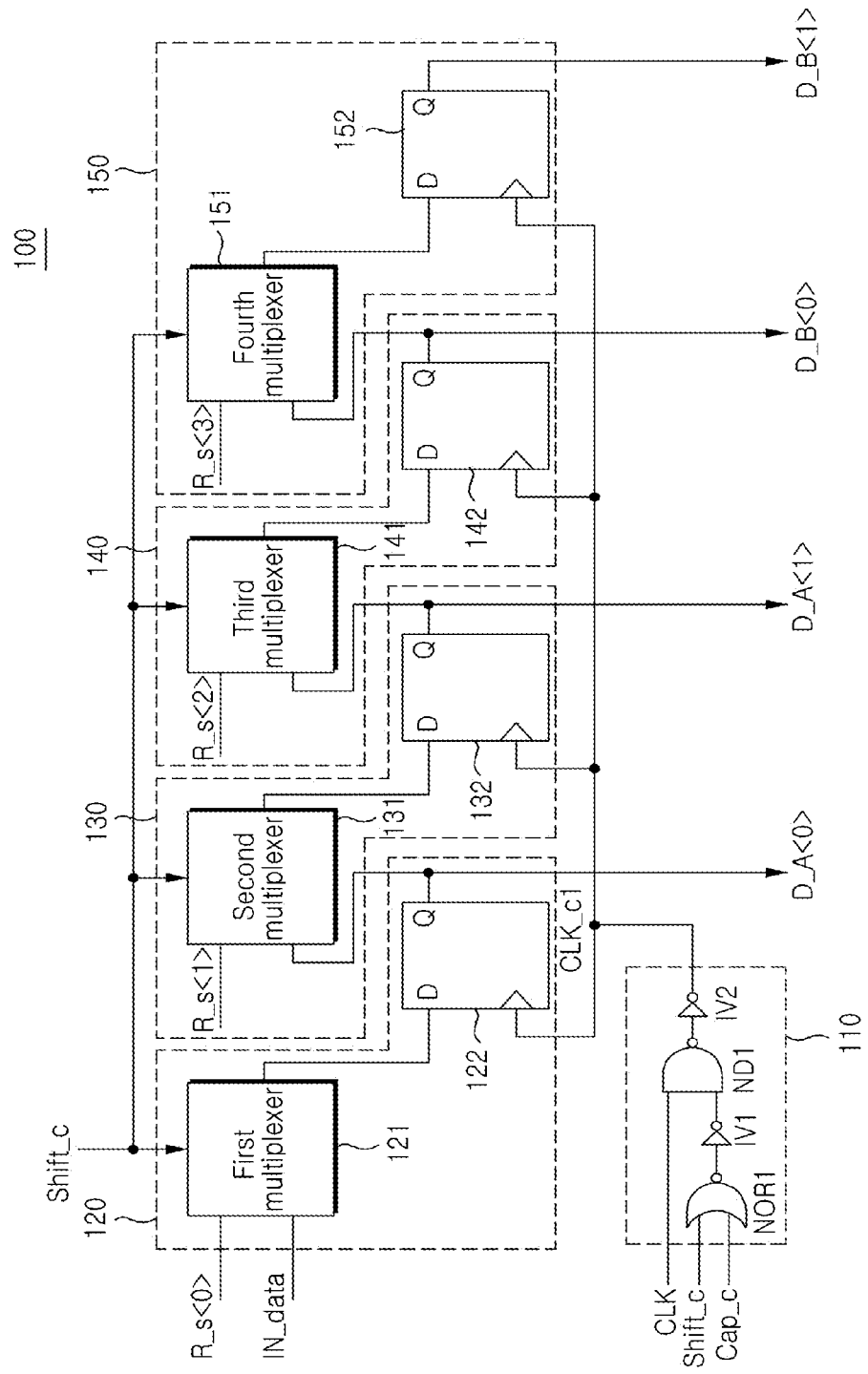
FIG. 2 is a configuration diagram illustrating a representation of an example of the register input selection block illustrated in FIG. 1.

Referring to FIG. 2, the register input selection block 100 may include a first clock control unit 110, and first to fourth signal selection input units 120, 130, 140 and 150.

The first clock control unit 110 outputs a clock CLK as a first control clock CLK_c1. The first clock control unit 110 may output the clock CLK as the first control clock CLK_c1 in response to the shift control signal Shift_c and the capture control signal Cap_c. For example, the first clock control unit 110 outputs the clock CLK as the first control clock CLK_c1 when even one of the shift control signal Shift_c and the capture control signal Cap_c is enabled. For example, the first clock control unit 110 fixes the first control clock CLK_c1 to a specific level, that is for example, a low level, when both the shift control signal Shift_c and the capture control signal Cap_c are disabled.

The first clock control unit 110 may include a NOR gate NOR1, a first NAND gate ND1, and first and second inverters IV1 and IV2. The NOR gate NOR1 is configured for receiving the shift control signal Shift_c and the capture control signal Cap_c. The first inverter IV1 is configured for receiving the output signal of the NOR gate NOR1. The first NAND gate ND1 is configured for receiving the output signal of the first inverter IV1 and the clock CLK. The second inverter IV2 is configured for receiving the output signal of the first NAND gate ND1, and for outputting the first control clock CLK_c1.

The first signal selection input unit 120 selects one of the first signal R_s<0> of the register selection output signals R_s<0:3> and the input data IN_data in response to the shift control signal Shift_c, and outputs the selected signal as the first data D_A<0> of the first data set D_A<0:1> in synchronization with the first control clock CLK_c1. For example, the first signal selection input unit 120 selects the input data IN_data when the shift control signal Shift_c is enabled, and receives and stores the selected signal and outputs the selected signal as the first data D_A<0> of the first data set D_A<0:1> when the first control clock CLK_c1 transitions to a specific level, that is, a high level. For example, the first signal selection input unit 120 selects the first signal R_s<0> of the register selection output signals R_s<0:3> when the shift control signal Shift_c is disabled, and receives and stores the selected signal and outputs the selected signal as the first data D_A<0> of the first data set D_A<0:1> when the first control clock CLK_c1 transitions to the specific level, that is, the high level. For example, in the example where the first control clock CLK_c1 is fixed to the low level, the first signal selection input unit 120 outputs the signal previously stored therein, as the first data D_A<0> of the first data set D_A<0:1>.

The first signal selection input unit 120 may include a first multiplexer 121 and a first flip-flop 122. The first multiplexer 121 selects and outputs one of the first signal R_s<0> of the register selection output signals R_s<0:3> and the input data IN_data. The first multiplexer 121 may select and output one of the first signal R_s<0> of the register selection output signals R_s<0:3> and the input data IN_data in response to the shift control signal Shift_c. The first flip-flop 122 may receive and store the output of the first multiplexer 121 and output the stored signal as the first data D_A<0> of the first data set D_A<0:1>, when the first control clock CLK_c1 transitions to the high level. When the first control clock CLK_c1 is fixed to the low level, the first flip-flop 122 outputs the signal previously stored therein, as the first data D_A<0> of the first data set D_A<0:1>, regardless of the output of the first multiplexer 121.

The second signal selection input unit 130 selects the second signal R_s<1> of the register selection output signals R_s<0:3> or the output of the first flip-flop 122, that is, the first data D_A<0> of the first data set D_A<0:1>, in response to the shift control signal Shift_c, and outputs the selected signal as the second data D_A<1> of the first data set D_A<0:1> in synchronization with the first control clock CLK_c1. For example, the second signal selection input unit 130 selects the first data D_A<0> of the first data set D_A<0:1> when the shift control signal Shift_c is enabled, and receives and stores the selected signal and outputs the selected signal as the second data D_A<1> of the first data set D_A<0:1> when the first control clock CLK_c1 transitions to the specific level, that is, the high level. For example, the second signal selection input unit 130 selects the second signal R_s<1> of the register selection output signals R_s<0:3> when the shift control signal Shift_c is disabled, and receives and stores the selected signal and outputs the selected signal as the second data D_A<1> of the first data set D_A<0:1> when the first control clock CLK_c1 transitions to the specific level, that is, the high level. For example, in the example where the first control clock CLK_c1 is fixed to the low level, the second signal selection input unit 130 outputs the signal previously stored therein, as the second data D_A<1> of the first data set D_A<0:1>.

The second signal selection input unit 130 may include a second multiplexer 131 and a second flip-flop 132. The second multiplexer 131 may select and output the second signal R_s<1> of the register selection output signals R_s<0:3> or the first data D_A<0> of the first data set D_A<0:1>. The second multiplexer 131 may select and output the second signal R_s<1> of the register selection output signals R_s<0:3> or the first data D_A<0> of the first data set D_A<0:1> in response to the shift control signal Shift_c. The second flip-flop 132 may receive and store the output of the second multiplexer 131 and output the stored signal as the second data D_A<1> of the first data set D_A<0:1>, when the first control clock CLK_c1 transitions to the high level. When the first control clock CLK_c1 is fixed to the low level, the second flip-flop 132 may output the signal previously stored therein, as the second data D_A<1> of the first data set D_A<0:1>, regardless of the output of the second multiplexer 131.

The third signal selection input unit 140 selects the third signal R_s<2> of the register selection output signals R_s<0:3> or the output of the second flip-flop 132, that is, the second data D_A<1> of the first data set D_A<0:1>, in response to the shift control signal Shift_c, and outputs the selected signal as the first data D_B<0> of the second data set D_B<0:1> in synchronization with the first control clock CLK_c1. For example, the third signal selection input unit 140 selects the second data D_A<1> of the first data set D_A<0:1> when the shift control signal Shift_c is enabled, and receives and stores the selected signal and outputs the selected signal as the first data D_B<0> of the second data set D_B<0:1> when the first control clock CLK_c1 transitions to the specific level, that is, the high level. For example, the third signal selection input unit 140 selects the third signal R_s<2> of the register selection output signals R_s<0:3> when the shift control signal Shift_c is disabled, and receives and stores the selected signal and outputs the selected signal as the first data D_B<0> of the second data set D_B<0:1> when the first control clock CLK_c1 transitions to the specific level, that is, the high level. For example, in the example where the first control clock CLK_c1 is fixed to the low level, the third signal selection input unit 140 outputs the signal previously stored therein, as the first data D_B<0> of the second data set D_B<0:1>.

The third signal selection input unit 140 may include a third multiplexer 141 and a third flip-flop 142. The third multiplexer 141 may select and output the third signal R_s<2> of the register selection output signals R_s<0:3> or the second data D_A<1> of the first data set D_A<0:1>. The third multiplexer 141 may select and output the third signal R_s<2> of the register selection output signals R_s<0:3> or the second data D_A<1> of the first data set D_A<0:1> in response to the shift control signal Shift_c. The third flip-flop 142 may receive and store the output of the third multiplexer 141 and output the stored signal as the first data D_B<0> of the second data set D_B<0:1>, when the first control clock CLK_c1 transitions to the high level. When the first control clock CLK_c1 is fixed to the low level, the third flip-flop 142 may output the signal previously stored therein, as the first data D_B<0> of the second data set D_B<0:1>, regardless of the output of the third multiplexer 141.

The fourth signal selection input unit 150 selects the fourth signal R_s<3> of the register selection output signals R_s<0:3> or the output of the third flip-flop 142, that is, the first data D_B<0> of the second data set D_B<0:1>, in response to the shift control signal Shift_c, and outputs the selected signal as the second data D_B<1> of the second data set D_B<0:1> in synchronization with the first control clock CLK_c1. For example, the fourth signal selection input unit 150 selects the first data D_B<0> of the second data set D_B<0:1> when the shift control signal Shift_c is enabled, and receives and stores the selected signal and outputs the selected signal as the second data D_B<1> of the second data set D_B<0:1> when the first control clock CLK_c1 transitions to the specific level, that is, the high level. For example, the fourth signal selection input unit 150 selects the fourth signal R_s<3> of the register selection output signals R_s<0:3> when the shift control signal Shift_c is disabled, and receives and stores the selected signal and outputs the selected signal as the second data D_B<1> of the second data set D_B<0:1> when the first control clock CLK_c1 transitions to the specific level, that is, the high level. For example, in the example where the first control clock CLK_c1 is fixed to the low level, the fourth signal selection input unit 150 outputs the signal previously stored therein, as the second data D_B<1> of the second data set D_B<0:1>.

The fourth signal selection input unit 150 may include a fourth multiplexer 151 and a fourth flip-flop 152. The fourth multiplexer 151 may select and output the fourth signal R_s<3> of the register selection output signals R_s<0:3> or the first data D_B<0> of the second data set D_B<0:1> in response to the shift control signal Shift_c. The fourth flip-flop 152 may receive and store the output of the fourth multiplexer 151 and output the stored signal as the second data D_B<1> of the second data set D_B<0:1>, when the first control clock CLK_c1 transitions to the high level. When the first control clock CLK_c1 is fixed to the low level, the fourth flip-flop 152 may output the signal previously stored therein, as the second data D_B<1> of the second data set D_B<0:1>, regardless of the output of the fourth multiplexer 151.

Figure 3:
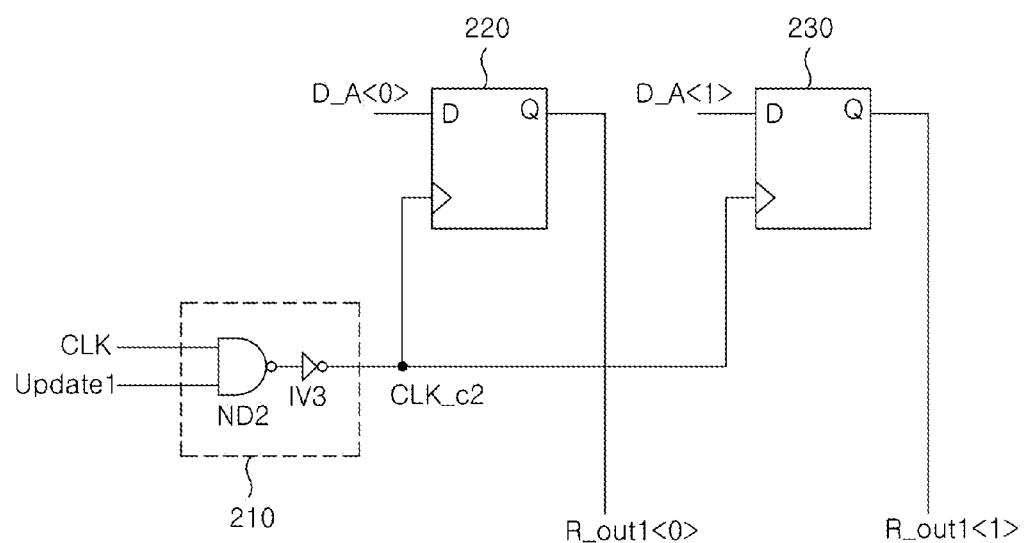
FIG. 3 is a configuration diagram illustrating a representation of an example of the first data register illustrated in FIG. 1.

Referring to FIG. 3, the first data register 200 may include a second clock control unit 210, and flip-flops 220 and 230 (i.e., fifth flip-flop 220 and sixth flip-flop 230).

The second clock control unit 210 may output the clock CLK as a second control clock CLK_c2 when the first update signal Update1 is, for example, enabled, and fixes the second control clock CLK_c2 to a low level when the first update signal Update1 is, for example, disabled.

The second clock control unit 210 may include a second NAND gate ND2, and a third inverter IV3. The second NAND gate ND2 receives the clock CLK and the first update signal Update1. The third inverter IV3 receives the output signal of the second NAND gate ND2, and outputs the second control clock CLK_c2.

The fifth flip-flop 220 may receive and store the first data D_A<0> of the first data set D_A<0:1> and may output the stored signal as the first signal R_out1<0> of the first register output signals R_out1<0:1>, when the second control clock CLK_c2 is a high level. The fifth flip-flop 220 may output the previous data stored therein, as the first signal R_out1<0> of the first register output signals R_out1<0:1>, regardless of the first data D_A<0> of the first data set D_A<0:1>, when the second control clock CLK_c2 is the low level.

The sixth flip-flop 230 may receive and store the second data D_A<1> of the first data set D_A<0:1> and may output the stored signal as the second signal R_out1<1> of the first register output signals R_out1<0:1>, when the second control clock CLK_c2 is the high level. The sixth flip-flop 230 may output the previous data stored therein, as the second signal R_out1<1> of the first register output signals R_out1<0:1>, regardless of the second data D_A<1> of the first data set D_A<0:1>, when the second control clock CLK_c2 is the low level.

Figure 4:
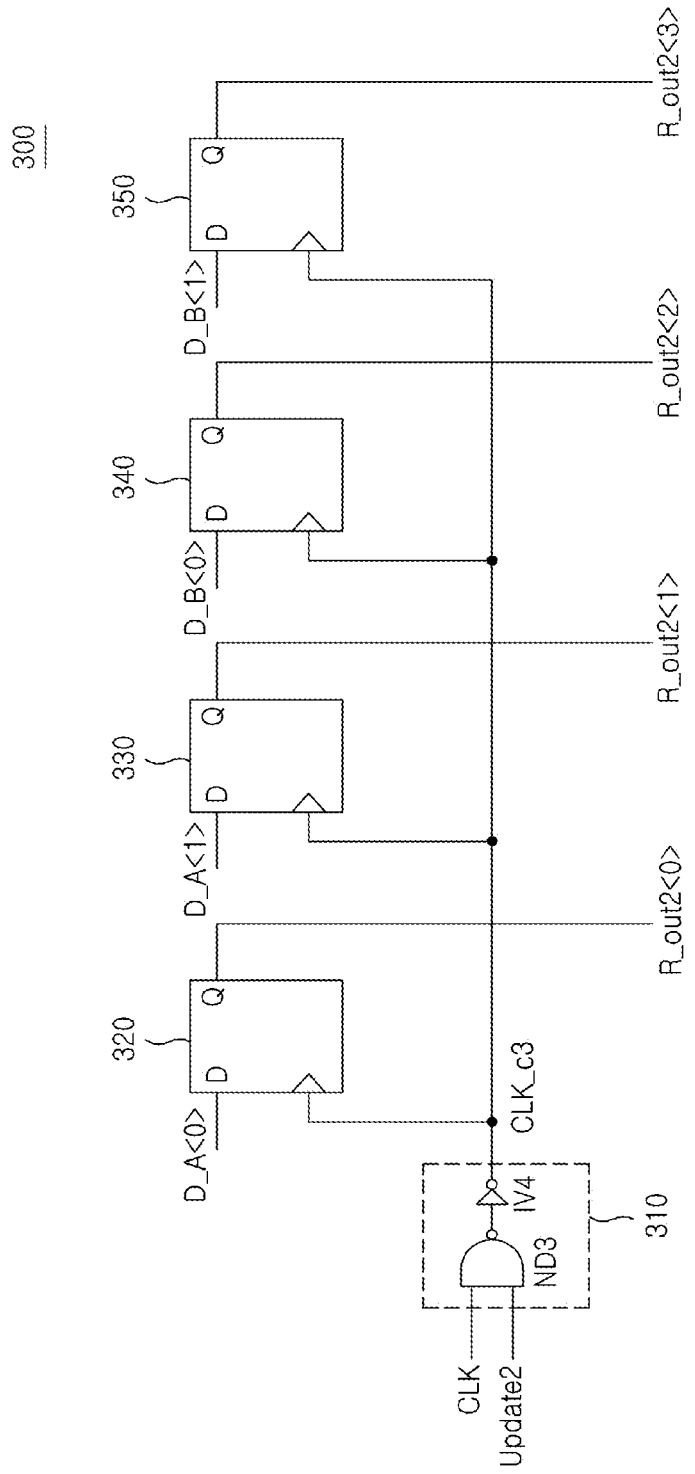
FIG. 4 is a configuration diagram illustrating a representation of an example of the second data register illustrated in FIG. 1.

Referring to FIG. 4, the second data register 300 may include a third clock control unit 310, and flip-flops 320, 330, 340 and 350 (i.e., seventh to tenth flip-flops 320, 330, 340 and 350).

The third clock control unit 310 may output the clock CLK as a third control clock CLK_c3. The third clock control unit 310 may output the clock CLK as the third control clock CLK_c3 in response to the second update signal Update2. For example, the third clock control unit 310 outputs the clock CLK as the third control clock CLK_c3 when the second update signal Update2 is enabled. For example, the third clock control unit 310 fixes the third control clock CLK_c3 to a low level when the second update signal Update2 is disabled.

The seventh flip-flop 320 may receive and store the first data D_A<0> of the first data set D_A<0:1> and may output the stored signal as the first signal R_out2<0> of the second register output signals R_out2<0:3>, when the third control clock CLK_c3 is, for example, at a high level. For example, the seventh flip-flop 320 may output the previous data stored therein, as the first signal R_out2<0> of the second register output signals R_out2<0:3>, regardless of the first data D_A<0> of the first data set D_A<0:1>, when the third control clock CLK_c3 is, for example, at the low level.

The eighth flip-flop 330 may receive and store the second data D_A<1> of the first data set D_A<0:1> and may output the stored signal as the second signal R_out2<1> of the second register output signals R_out2<0:3>, when the third control clock CLK_c3 is, for example, at the high level. For example, the eighth flip-flop 330 may output the previous data stored therein, as the second signal R_out2<1> of the second register output signals R_out2<0:3>, regardless of the second data D_A<1> of the first data set D_A<0:1>, when the third control clock CLK_c3 is, for example, at the low level.

The ninth flip-flop 340 may receive and store the first data D_B<0> of the second data set D_B<0:1> and may output the stored signal as the third signal R_out2<2> of the second register output signals R_out2<0:3>, when the third control clock CLK_c3 is, for example, at the high level. For example, the ninth flip-flop 340 may output the previous data stored therein, as the third signal R_out2<2> of the second register output signals R_out2<0:3>, regardless of the first data D_B<0> of the second data set D_B<0:1>, when the third control clock CLK_c3 is, for example, at the low level.

The tenth flip-flop 350 may receive and store the second data D_B<1> of the second data set D_B<0:1> and may output the stored signal as the fourth signal R_out2<3> of the second register output signals R_out2<0:3>, when the third control clock CLK_c3 is, for example, at the high level. For example, the tenth flip-flop 350 may output the previous data stored therein, as the fourth signal R_out2<3> of the second register output signals R_out2<0:3>, regardless of the second data D_B<1> of the second data set D_B<0:1>, when the third control clock CLK_c3 is, for example, at the low level.

Operations of the semiconductor apparatus in accordance with the various embodiments, configured as mentioned above, will be described below.

First described, is an example of operations for storing data in the first and second data registers 200 and 300.

In order to store data in the first and second data registers 200 and 300, the shift control signal Shift_c is enabled and the capture control signal Cap_c is disabled.

Operations of the register input selection block 100 will be described with reference to FIG. 2.

The first clock control unit 110 outputs the clock CLK as the first control clock CLK_c1 when the shift control signal Shift_c is enabled.

The first signal selection input unit 120 receives and stores the input data IN_data and outputs the stored signal as the first data D_A<0> of the first data set D_A<0:1>, when the first control clock CLK_c1 transitions to the high level, if the shift control signal Shift_c is enabled.

The second signal selection input unit 130 receives and stores the output signal of the first signal selection input unit 120, that is, the first data D_A<0> of the first data set D_A<0:1>, and outputs the stored signal as the second data D_A<1> of the first data set D_A<0:1>, when the first control clock CLK_c1 transitions to the high level, if the shift control signal Shift_c is enabled.

The third signal selection input unit 140 receives and stores the output signal of the second signal selection input unit 130, that is, the second data D_A<1> of the first data set D_A<0:1>, and outputs the stored signal as the first data D_B<0> of the second data set D_B<0:1>, when the first control clock CLK_c1 transitions to the high level, if the shift control signal Shift_c is enabled.

The fourth signal selection input unit 150 receives and stores the output signal of the third signal selection input unit 140, that is, the first data D_B<0> of the second data set D_B<0:1>, and outputs the stored signal as the second data D_B<1> of the second data set D_B<0:1>, when the first control clock CLK_c1 transitions to the high level, if the shift control signal Shift_c is enabled.

Summarizing these, the first signal selection input unit 120 receives and stores the input data IN_data and outputs the stored signal when the shift control signal Shift_c is enabled and the first control clock CLK_c1 transitions to the high level. The second signal selection input unit 130 receives and stores the output of the first signal selection input unit 120 and outputs the stored signal when the shift control signal Shift_c is enabled and the first control clock CLK_c1 transitions to the high level. The third signal selection input unit 140 receives and stores the output of the second signal selection input unit 130 and outputs the stored signal when the shift control signal Shift_c is enabled and the first control clock CLK_c1 transitions to the high level. The fourth signal selection input unit 150 receives and stores the output of the third signal selection input unit 140 and outputs the stored signal when the shift control signal Shift_c is enabled and the first control clock CLK_c1 transitions to the high level.

That is to say, the first to fourth signal selection input units 120, 130, 140 and 150 receive and store the input data IN_data inputted in series and output stored signals in a parallel type, each time the first control clock CLK_c1 transitions to the high level, when the shift control signal Shift_c is enabled.

The first data register 200 receives and stores the first data set D_A<0:1>, that is, the outputs of the first and second signal selection input units 120 and 130, and outputs the stored signals as the first register output signals R_out1<0:1>, when the first update signal Update1 is enabled.

Example operations of the first data register 200 will be described with reference to FIG. 3.

For example but not limited to, the second clock control unit 210 outputs the clock CLK as the second control clock CLK_c2, when the first update signal Update1 is enabled.

The fifth flip-flop 220 receives and stores the first data D_A<0> of the first data set D_A<0:1> and outputs the stored signal as the first signal R_out1<0> of the first register output signals R_out1<0:1>, when the second control clock CLK_c2 transitions to the high level.

The sixth flip-flop 230 receives and stores the second data D_A<1> of the first data set D_A<0:1> and outputs the stored signal as the second signal R_out1<1> of the first register output signals R_out1<0:1>, when the second control clock CLK_c2 transitions to the high level.

The second data register 300 receives and stores the first data set D_A<0:1> and the second data set D_B<0:1> and outputs the stored signals as the second register output signals R_out2<0:3>, when the second update signal Update2 is enabled.

Example operations of the second data register 300 will be described below with reference to FIG. 4.

For example but not limited to, the third clock control unit 310 outputs the clock CLK as the third control clock CLK_c3, when the second update signal Update2 is enabled.

The seventh flip-flop 320 receives and stores the first data D_A<0> of the first data set D_A<0:1> and outputs the stored data as the first signal R_out2<0> of the second register output signals R_out2<0:3>, when the third control clock CLK_c3 transitions to the high level.

The eighth flip-flop 330 receives and stores the second data D_A<1> of the first data set D_A<0:1> and outputs the stored data as the second signal R_out2<1> of the second register output signals R_out2<0:3>, when the third control clock CLK_c3 transitions to the high level.

The ninth flip-flop 340 receives and stores the first data D_B<0> of the second data set D_B<0:1> and outputs the stored data as the third signal R_out2<2> of the second register output signals R_out2<0:3>, when the third control clock CLK_c3 transitions to the high level.

The tenth flip-flop 350 receives and stores the second data D_B<1> of the second data set D_B<0:1> and outputs the stored data as the fourth signal R_out2<3> of the second register output signals R_out2<0:3>, when the third control clock CLK_c3 transitions to the high level.

Example operations for storing data in the first data register 200 will be described below.

For example but not limited to, if the shift control signal Shift_c is enabled and the first update signal Update1 is enabled, the register input selection block 100 outputs the input data IN_data as the first data set D_A<0:1>, and the first data register 200 receives and stores the first data set D_A<0:1>. The first data register 200 outputs the stored data as the first register output signals R_out1<0:1>.

Example operations for storing data in the second data register 300 will be described below.

For example but not limited to, if the shift control signal Shift_c is enabled and the second update signal Update2 is enabled, the register input selection block 100 outputs the input data IN_data as the first and second data sets D_A<0:1> and D_B<0:1>, and the second data register 300 receives and stores the first and second data sets D_A<0:1> and D_B<0:1>. The second data register 300 outputs the stored data as the second register output signals R_out2<0:3>.

Example operations for outputting the data stored in the first and second data registers 200 and 300 will be described.

For example, in order to output the data stored in the first and second data registers 200 and 300, the shift control signal Shift_c is disabled, and the capture control signal Cap_c is enabled.

The first and second data registers 200 and 300 output the data stored therein, as the first and second register output signals R_out1<0:1> and R_out2<0:3>, respectively.

Example operations for outputting the data stored in the first data register 200 will be described.

For example but not limited to, if the selection signal Select_s is enabled, the register output selection block 400 outputs the first register output signals R_out1<0:1> as the register selection output signals R_s<0:3>. The first register output signals R_out1<0:1> are outputted as the first and second signals R_s<0:1> of the register selection output signals R_s<0:3>, and the remaining register selection output signals R_s<2:3> are disregarded.

The register input selection block 100 outputs the first and second signals R_s<0:1> of the register selection output signals R_s<0:3> instead of the input data IN_data, as the first data set D_A<0:1>, in response to the disabled shift control signal Shift_c and the enabled capture control signal Cap_c.

Referring to FIG. 2, the first clock control unit 110 may output the clock CLK as the first control clock CLK_c1 in response to the enabled capture control signal Cap_c.

The first and second signal selection input units 120 and 130 may receive and store the first and second signals R_s<0:1> of the register selection output signals R_s<0:3> in response to the disabled shift control signal Shift_c.

In other words, in order to output the data stored in the first data register 200, the shift control signal Shift_c is disabled, and the capture control signal Cap_c is enabled. If the selection signal Select_s is enabled, the first register output signals R_out1<0:1> stored in the first data register 200 are stored in the register input selection block 100 and are outputted as the first data set D_A<0:1>. The data stored in the first data register 200 are stored in the register input selection block 100.

The data output selection block 500 outputs the second data D_A<1> of the first data set D_A<0:1> as the output data OUT_data in response to the enabled selection signal Select_s.

The second data D_A<1> of the first data set D_A<0:1> stored in the second signal selection input unit 130 of the register input selection block 100 may be outputted as the output data OUT_data by the data output selection block 500.

Thereafter, the capture control signal Cap_c is disabled, and the shift control signal Shift_c is enabled.

If the shift control signal Shift_c is enabled, the second signal selection input unit 130 of the register input selection block 100 receives and stores the output signal of the first signal selection input unit 120, that is, the first data D_A<0> of the first data set D_A<0:1>, and outputs the stored data as the second data D_A<1> of the first data set D_A<0:1>. At this time, the output of the second signal selection input unit 130 is outputted as the output data OUT_data by the data output selection block 500. After the data stored in the second signal selection input unit 130 is outputted by the data output selection block 500, if the clock CLK transitions, the data stored in the first signal selection input unit 120 is inputted to and stored in the second signal selection input unit 130 and is outputted as the output data OUT_data by the data output selection block 500.

By this fact, the data stored in the first data register 200 is outputted as the output data OUT_data by the data output selection block 500.

Example operations for outputting the data stored in the second data register 300 will be described.

For example, but not limited to, if the selection signal Select_s is disabled, the register output selection block 400 outputs the second register output signals R_out2<0:3> as the register selection output signals R_s<0:3>.

If the capture control signal Cap_c is enabled and the shift control signal Shift_c is disabled, the register input selection block 100 receives and stores the second register selection output signals R_s<0:3>, and outputs the stored signals as the first and second data sets D_A<0:1> and D_B<0:1>.

By the disabled selection signal Select_s, the data output selection block 500 outputs the second data D_B<1> of the second data set D_B<0:1> as the output data OUT_data.

Thereafter, if the capture control signal Cap_c is disabled and the shift control signal Shift_c is enabled, the fourth signal selection input unit 150 receives the output of the third signal selection input unit 140, the third signal selection input unit 140 receives the output of the second signal selection input unit 130, and the second signal selection input unit 130 receives the output of the first signal selection input unit 120. Accordingly, each time the clock CLK transitions to a high level, the signal stored in the third signal selection input unit 140 is shifted to, stored in and outputted from the fourth signal selection input unit 150, the signal stored in the second signal selection input unit 130 is shifted to, stored in and outputted from the third signal selection input unit 140, and the signal stored in the first signal selection input unit 120 is shifted to, stored in and outputted from the second signal selection input unit 130. As a result, the output signals R_out2<0:3> of the second data register 300 are stored as the first and second data sets D_A<0:1> and D_B<0:1> in the register input selection block 100. Then, each time the clock CLK transitions to the high level, the first and second data sets D_A<0:1> and D_B<0:1> are outputted as the data D_B<1>, D_B<0>, D_A<1> and D_A<0> of a serial type, that is, the output data OUT_data, by the data output selection block 500.

In summary, an operating method of the semiconductor apparatus in accordance with an embodiment may include a data inputting step of outputting input data of a serial type as at least one data set of a parallel type by enabling a shift control signal and disabling a capture control signal. The operating method of the semiconductor apparatus may include a data storing step of storing the at least one data set in one of a plurality of data registers in response to a plurality of update signals. The operating method of the semiconductor apparatus may include a data selecting step of selecting data stored in one of the plurality of data registers and outputting the data stored in the selected data register, as register selection output signals, in response to a selection signal. The operating method of the semiconductor apparatus may include a data capturing step of storing the register selection output signals and outputting the stored signals as first and second data sets, by disabling the shift control signal and enabling the capture control signal. The operating method of the semiconductor apparatus may include a data shifting step of shifting the respective bits of the first and second data sets of a parallel type and outputting data of a serial type, by enabling the shift control signal and disabling the capture control signal. The operating method of the semiconductor apparatus may include a data outputting step of outputting one of the shifted first and second data sets, as output data, in response to the selection signal. The register input selection block 100 illustrated in FIGS. 1 and 2 performs the data inputting step, the data capturing step, and the data shifting step. In detail, when considering that the register input selection block 100 includes the plurality of flip-flops 122, 132, 142 and 152, the data inputting step is a step in which the plurality of flip-flops 122, 132, 142 and 152 electrically coupled in series respectively shift the input data IN_data and generate the data sets, the data capturing step is a step in which the register selection output signals R_s<0:3> of a parallel type are respectively stored in the plurality of flip-flops 122, 132, 142 and 152, and the data shifting step is a step in which the signals respectively stored in the plurality of flip-flops 122, 132, 142 and 152 electrically coupled in series are shifted. As a result, the register input selection block 100 electrically couples the plurality of flip-flops 122, 132, 142 and 152 in a serial type or in a parallel type in response to the shift control signal Shift_c. In the example where the plurality of flip-flops 122, 132, 142 and 152 are electrically coupled in series, the data inputting step and the data shifting step are simultaneously performed, and, in the example where the plurality of flip-flops 122, 132, 142 and 152 are electrically coupled in parallel, the data capturing step of storing the respective register selection output signals R_s<0:3> of a parallel type is performed.

While the configurations and operations of the semiconductor apparatus in accordance with the various embodiments were described above by taking an example providing two data registers, it is to be noted that the number of data registers not specifically limited. Also, while it was described that different sizes of data are stored by taking an example providing data registers of different sizes, a person skilled in the art will readily appreciate that realizing data registers of the same size is nothing but a simple design change.

Figure 5:
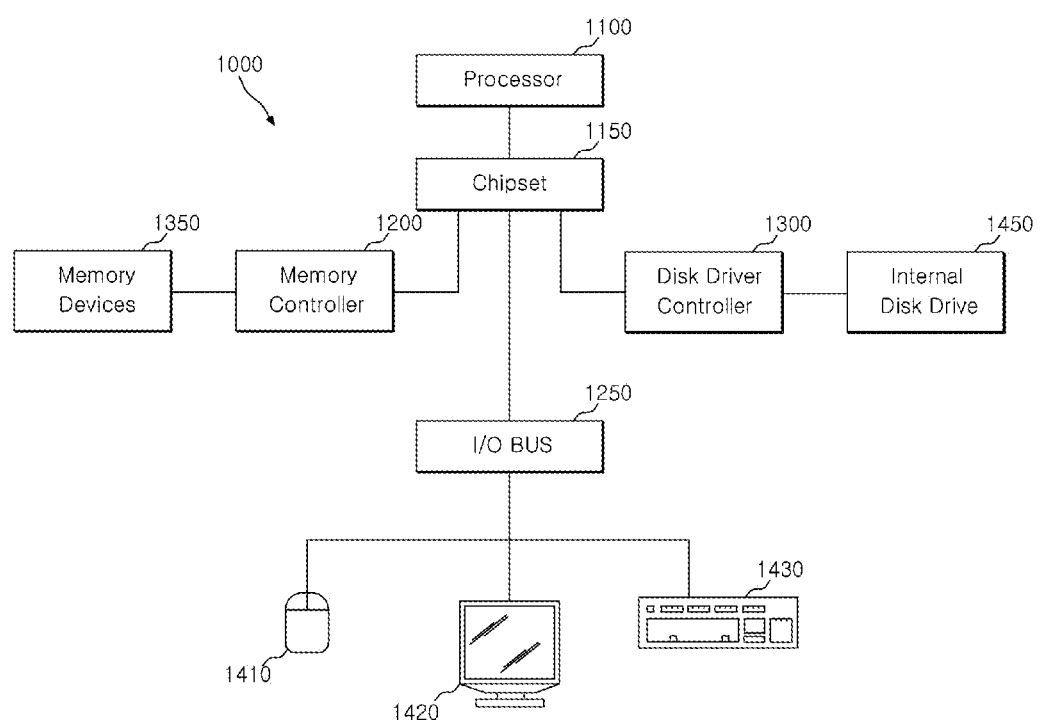
FIG. 5 illustrates a block diagram of an example of a representation of a system employing the semiconductor apparatus in accordance with the embodiments discussed above with relation to FIGS. 1-4.

The test path compensating circuit discussed above (see FIGS. 1-4) are particular useful in the design of memory devices, processors, and computer systems. For example, referring to FIG. 5, a block diagram of a system employing the semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor apparatus and the operating method thereof described herein should not be limited based on the described embodiments.

What is claimed is:

1. A semiconductor apparatus comprising:
   a register input selection circuit configured to receive input data of a serial type and output the input data as a first data set and a second data set of a parallel type, or receive register selection output signals and output the register selection output signals as the first and second data sets, in response to a shift control signal and a capture control signal;
   a first data register configured to receive and store the first data set and output stored data as first register output signals;
   a second data register configured to receive and store the first and second data sets and output stored data as second register output signals;
   a register output selection circuit configured to output ones of the first and second register output signals as the register selection output signals; and
   a data output selection circuit configured to serially output one of the first and second data sets as output data.

2. The semiconductor apparatus according to claim 1,
   wherein the first data register receives and stores the first data set and output the stored data as the first register output signals, in response to a first update signal,
   wherein the second data register receives and stores the first and second data sets and output the stored data as the second register output signals, in response to a second update signal,
   wherein the register output selection circuit outputs ones of the first and second register output signals as the register selection output signals, in response to a selection signal, and
   wherein the data output selection circuit serially outputs one of the first and second data sets as the output data, in response to the selection signal.

3. The semiconductor apparatus according to claim 2,
   wherein the register input selection circuit receives and stores the input data and outputs stored signals as the first data set and the second data set, when the shift control signal is enabled and the capture control signal is disabled, and
   wherein the register input selection circuit receives and stores the register selection output signals and outputs stored signals as the first and second data sets, when the shift control signal is disabled and the capture control signal is enabled.

4. The semiconductor apparatus according to claim 3, wherein the register input selection circuit comprises:
   a clock control unit configured to receive a clock and output a clock as a control clock when either one of the shift control signal or the capture control signal is enabled; and
   a plurality of signal selection input units configured to receive and store ones of the input data and the register selection output signals and output stored signals as the first and second data sets, in response to the shift control signal and the control clock.

5. The semiconductor apparatus according to claim 4, wherein each of the plurality of signal selection input units comprises:
   a multiplexer configured to select an input thereto in response to the shift control signal; and
   a flip-flop configured to receive and store an output of the multiplexer and output a stored signal, when the control clock shifts to a specific level.

6. The semiconductor apparatus according to claim 5,
   wherein the plurality of signal selection input units comprise a first signal selection input unit and a second signal selection input unit,
   wherein the first signal selection input unit selects a part of the input data or the register selection output signals in response to the shift control signal, receives and stores selected signals when the control clock transitions to the specific level, and outputs stored signals, and
   wherein the second signal selection input unit selects an output of the first signal selection input unit or a remainder of the register selection output signals in response to the shift control signal, receives and stores selected signals when the control clock transitions to the specific level, and outputs stored signals.

7. The semiconductor apparatus according to claim 2, wherein the first data register receives and stores the first data set and outputs stored data as the first register output signals, when the first update signal is enabled.

8. The semiconductor apparatus according to claim 2, wherein the second data register receives and stores the first and second data sets and outputs stored data as the second register output signals, when the second update signal is enabled.

9. The semiconductor apparatus according to claim 2,
wherein the register output selection circuit outputs the first register output signals as the register selection output signals when the selection signal is enabled, and
wherein the register output selection circuit outputs the second register output signals as the register selection output signals when the selection signal is disabled.

10. The semiconductor apparatus according to claim 2,
wherein the data output selection circuit outputs the first data set as the output data when the selection signal is enabled, and
wherein the data output selection circuit outputs the second data set as the output data when the selection signal is disabled.

11. An operating method of a semiconductor apparatus, comprising:
a data inputting action of outputting input data of a serial type as at least one data set of a parallel type;
a data storing action of storing the at least one data set in one of a plurality of data registers;
a data selecting action of selecting data stored in one of the plurality of data registers and outputting the data stored in the selected data register, as register selection output signals;
a data capturing action of storing the register selection output signals and outputting stored signals as first and second data sets;
a data shifting action of shifting respective bits of the first and second data sets of a parallel type; and
a data outputting action of outputting one of the shifted first and second data sets, as output data.

12. The operating method according to claim 11,
wherein the data inputting action is performed when a shift control signal is enabled and a capture control signal is disabled,
wherein data storing action is performed in response to a plurality of update signals,
wherein the data selecting action is performed in response to a selection signal,
wherein the data capturing action is performed when the shift control signal is disabled and the capture control signal is enabled,
wherein the data shifting action is performed when the shift control signal is enabled and the capture control signal is disabled, and
wherein the data outputting action is performed in response to the selection signal.

13. The operating method according to claim 12, wherein the data inputting action, the data capturing action and the data shifting action are operations performed by a register input selection circuit.

14. The operating method according to claim 13,
wherein the register input selection circuit comprises a plurality of flip-flops,
wherein the data inputting action comprises an action of respectively shifting the input data and generating data sets with the plurality of flip-flops electrically coupled in series,
wherein the data capturing action comprises an action of respectively storing in the plurality of flip-flops the register selection output signals of a parallel type, and
wherein the data shifting action comprises an action shifting signals stored in the plurality of flip-flops electrically coupled in series.

15. The operating method according to claim 14, wherein the data inputting action and the data shifting action are simultaneously performed.

16. The operating method according to claim 15, wherein the plurality of flip-flops are electrically coupled in a serial type or in a parallel type in response to the shift control signal.

17. A semiconductor apparatus comprising:
a register input selection circuit configured to serially receive input data and output the input data in parallel as a first data set and a second data set, or receive register selection output signals in parallel and output the register selection output signals in parallel as the first and second data sets;
a first data register configured to receive and store the first data set and output stored data as first register output signals;
a second data register configured to receive and store the first and second data sets and output stored data as second register output signals;
a register output selection circuit configured to output at least one of the first and second register output signals as the register selection output signals; and
a data output selection circuit configured to serially output one of the first and second data sets as output data.

* * * * *